US009608165B2

(12) United States Patent
Kim et al.

(10) Patent No.: US 9,608,165 B2
(45) Date of Patent: Mar. 28, 2017

(54) LIGHT EMITTING DIODE AND METHOD OF FABRICATING THE SAME

(71) Applicant: Seoul Viosys Co., Ltd., Ansan-si (KR)

(72) Inventors: Kyung Wan Kim, Ansan-si (KR); Tae Kyoon Kim, Ansan-si (KR); Yeo Jin Yoon, Ansan-si (KR); Ye Seul Kim, Ansan-si (KR); Sang Hyun Oh, Ansan-si (KR); Jin Woong Lee, Ansan-si (KR); In Soo Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/795,167

(22) Filed: Jul. 9, 2015

(65) Prior Publication Data

US 2015/0311390 A1     Oct. 29, 2015

Related U.S. Application Data

(62) Division of application No. 14/067,455, filed on Oct. 30, 2013, now Pat. No. 9,112,102.

(30) Foreign Application Priority Data

Oct. 30, 2012 (KR) .......................... 10-2012-0121535
Oct. 31, 2012 (KR) .......................... 10-2012-0122554

(51) Int. Cl.
*H01L 33/36* (2010.01)
*H01L 33/38* (2010.01)
*H01L 33/22* (2010.01)
*H01L 33/30* (2010.01)
*H01L 33/32* (2010.01)
(Continued)

(52) U.S. Cl.
CPC ........ *H01L 33/385* (2013.01); *H01L 33/0095* (2013.01); *H01L 33/22* (2013.01); *H01L 33/30* (2013.01); *H01L 33/32* (2013.01); *H01L 33/025* (2013.01); *H01L 33/20* (2013.01);
(Continued)

(58) Field of Classification Search
CPC ..................................................... H01L 33/385
See application file for complete search history.

(56) References Cited

U.S. PATENT DOCUMENTS 5,087,949 A   2/1992  Haitz
5,517,039 A   5/1996  Holonyak et al.
(Continued)

FOREIGN PATENT DOCUMENTS

KR   10-2012-0083740       7/2012
WO   WO11004437         *  1/2016

OTHER PUBLICATIONS

Non-Final Office Action issued on Feb. 20, 2015, in U.S. Appl. No. 14/067,455.
(Continued)

*Primary Examiner* — Fei Fei Yeung Lopez
(74) *Attorney, Agent, or Firm* — H.C. Park & Associates, PLC

(57) ABSTRACT

A method of fabricating a light emitting diode (LED) includes: sequentially stacking a first conductivity-type semiconductor layer, an active layer, and a second conductivity-type semiconductor layer on a substrate; and separating the substrate into unit chips, and at the same time, forming a concavo-convex structure having the shape of irregular vertical lines in a side surface of the unit chip.

19 Claims, 17 Drawing Sheets

(51) Int. Cl.
_H01L 33/00_ (2010.01)
_H01L 33/02_ (2010.01)
_H01L 33/20_ (2010.01)

(52) U.S. Cl.
CPC ................ _H01L 2933/0016_ (2013.01); _H01L 2933/0058_ (2013.01)

(56) References Cited

U.S. PATENT DOCUMENTS

| | | | | |
|---|---|---|---|---|
| 5,543,365 | A * | 8/1996 | Wills | H01L 21/78 |
| | | | | 148/DIG. 28 |
| 2002/0093023 | A1* | 7/2002 | Camras | H01L 33/02 |
| | | | | 257/94 |
| 2003/0015713 | A1* | 1/2003 | Yoo | H01L 33/32 |
| | | | | 257/79 |
| 2008/0290353 | A1* | 11/2008 | Medendorp, Jr. | H01L 25/167 |
| | | | | 257/89 |
| 2010/0213166 | A1* | 8/2010 | Kray | H01L 21/268 |
| | | | | 216/37 |
| 2011/0284894 | A1* | 11/2011 | Beom | H01L 33/20 |
| | | | | 257/98 |
| 2012/0074105 | A1* | 3/2012 | Okamoto | B23K 26/146 |
| | | | | 219/121.62 |

OTHER PUBLICATIONS

Notice of Allowance issued on Apr. 14, 2015, in U.S. Appl. No. 14/067,455.

\* cited by examiner

LIGHT EMITTING DIODE AND METHOD OF FABRICATING THE SAME

CROSS-REFERENCE TO RELATED APPLICATIONS

This application is a divisional of U.S. patent application Ser. No. 14/067,455, filed on Oct. 30, 2013, and claims priority from and the benefit of Korean Patent Application Nos. 10-2012-0121535, filed on Oct. 30, 2012, and 10-2012-0122554, filed on Oct. 31, 2012, which are herein incorporated by reference for all purposes as if fully set forth herein.

BACKGROUND

Field

The present invention relates to a semiconductor device, and more specifically, to a light emitting diode (LED).

Discussion of the Background

A light emitting diode (LED) is a device including an n-type semiconductor layer, a p-type semiconductor layer, and an active layer disposed between the n-type semiconductor layer and the p-type semiconductor layer. When a forward electric field is applied to the n-type and p-type semiconductor layers, electrons and holes are injected into the active layer, and the electrons and holes injected into the active layer are recombined to emit light.

Efficiency of the LED may depend on internal quantum efficiency and external quantum efficiency known as light extraction efficiency. In order to increase the light extraction efficiency, there is a method in which a concavo-convex pattern is formed on a substrate, for example, a patterned sapphire substrate (PSS), and then a semiconductor layer is grown on the concavo-convex pattern. However, the light extraction efficiency may still remain low.

As another method of increasing the light extraction efficiency, Korean Patent Publication No. 2012-0083740 discloses the formation of a concavo-convex pattern on an upper surface of an LED.

SUMMARY

The formation of the concavo-convex pattern on the upper surface of an LED may serve to increase the light extraction efficiency. However, it is unknown to form a concavo-convex pattern on a side surface of an LED. The side surface of an LED, that is, a side surface of a unit chip, may be formed during a scribing process using a laser. A dry laser currently in use forms the unit chip having a smooth side surface with no concavo-convex pattern.

Exemplary embodiments of the present invention overcome the above disadvantages and other disadvantages not described above. In addition, the present invention is not required to overcome the disadvantages described above, and an exemplary embodiment of the present invention may not overcome any of the problems described above.

An exemplary embodiment of the present invention provides a light emitting diode (LED) with significantly improved light extraction efficiency by forming a concavo-convex structure in a side surface of a unit chip of the LED, and a method of fabricating the same.

According to an aspect of the present invention, an LED includes a unit chip having a substrate and a first conductivity-type semiconductor layer, an active layer, and a second conductivity-type semiconductor layer which are sequentially stacked on the substrate. A side surface of the unit chip includes a concavo-convex structure having the shape of irregular vertical lines.

According to another aspect of the present invention, an LED includes a unit chip having a substrate and a first conductivity-type semiconductor layer, an active layer, and a second conductivity-type semiconductor layer which are sequentially stacked on the substrate. A side surface of the unit chip has a first face perpendicular to an upper surface of the substrate, and a second face inclined with respect to the first face. An angle $\theta_1$ formed by a normal line to the first face and a normal line to the second face is less than 90 degrees.

According to still another aspect of the present invention, a method of fabricating an LED includes sequentially stacking a first conductivity-type semiconductor layer, an active layer, and a second conductivity-type semiconductor layer on a substrate, separating the substrate into unit chips, and at the same time, forming a concavo-convex structure having the shape of irregular vertical lines in a side surface of the unit chip. The separating of the substrate into the unit chips may include scribing the substrate using a fluid-jet-guided laser.

According to yet another aspect of the present invention, a method of fabricating an LED includes sequentially stacking a first conductivity-type semiconductor layer, an active layer, and a second conductivity-type semiconductor layer on a substrate, separating the substrate into unit chips, and at the same time, forming a first face perpendicular to an upper surface of the substrate, and a second face inclined with respect to the first face in a side surface of the unit chip. An angle $\theta_1$ formed by a normal line to the first face and a normal line to the second face, is less than 90 degrees.

According to yet another aspect of the present invention, an LED includes a unit chip including a substrate and a first conductivity-type semiconductor layer, an active layer, and a second conductivity-type semiconductor layer which are sequentially stacked on the substrate. At least a part of a side surface of the unit chip has a doped region.

According to yet another aspect of the present invention, a method of fabricating an LED includes sequentially stacking a first conductivity-type semiconductor layer, an active layer, and a second conductivity-type semiconductor layer on a substrate, separating the substrate into unit chips, and forming a doped region in at least a part of a side surface of the unit chip exposed during the separation.

Additional and/or other aspects and advantages of the invention will be set forth in part in the description which follows and, in part, will be obvious from the description, or may be learned by practice of the invention.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE ILLUSTRATED EMBODIMENTS

Figure 1A:
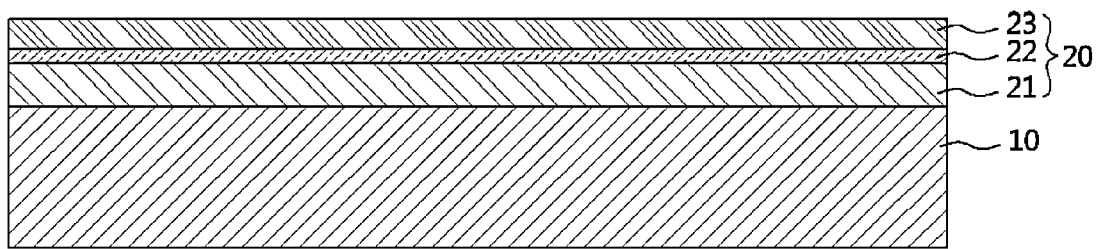
FIGS. 1A to 1D are cross-sectional views showing a method of fabricating a light emitting diode according to an exemplary embodiment of the present invention.

Certain exemplary embodiments of the present invention will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments of the present invention can be carried out without those specifically defined matters. Also, well-known functions or constructions are not described in detail since they would obscure the invention with unnecessary detail.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be also understood that when an element is "on" another element, it can be directly on the other element or intervening elements may be present. Other words used to describe the relationship between elements should be interpreted in a like fashion (i.e., "between" versus "directly between", "adjacent" versus "directly adjacent", etc.). The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In addition, as used herein, directional expressions such as upward, upper (portion), an upper surface, etc. may also be understood as the meanings of downward, lower (portion), a lower surface, etc. In other words, expressions of spatial directions should be understood as relative directions, but should not be limitedly understood as denoting absolute directions.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A to 1D are cross-sectional views showing a method of fabricating a light emitting diode according to an exemplary embodiment of the present invention. FIG. 2 is a perspective view showing a unit chip formed according to the fabrication method described in FIGS. 1A to 1D.

Figure 2:
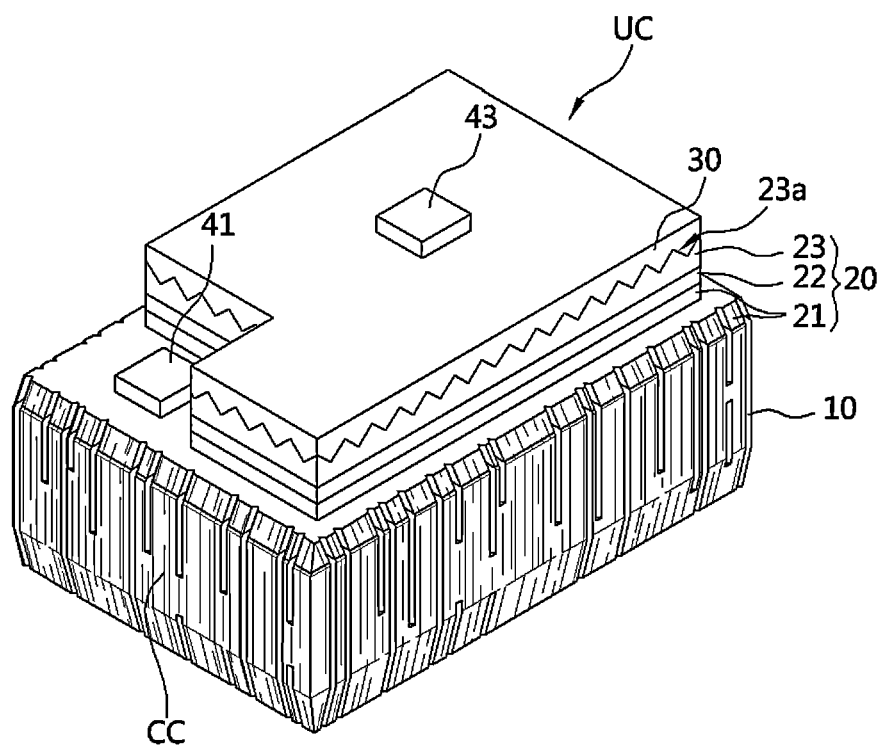
FIG. 2 is a perspective view showing a unit chip formed according to the fabrication method described in FIGS. 1A to 1D.

Referring to FIG. 1A, a substrate 10 is provided. The substrate 10 may be sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. For example, the substrate 10 may be a GaN substrate as an example of a nitride semiconductor substrate.

A first conductivity-type semiconductor layer 21, an active layer 22, and a second conductivity-type semiconductor layer 23 may be formed on the substrate 10. The first conductivity-type semiconductor layer 21, the active layer 22, and the second conductivity-type semiconductor layer 23 may configure a semiconductor structure 20.

The first conductivity-type semiconductor layer 21 may be a nitride-based semiconductor layer and doped with n-type dopant. For example, the first conductivity-type semiconductor layer 21 may be an $In_xAl_yGa_{1-x-y}N$ ($0 \leq x \leq 1$, $0 \leq y \leq 1$, $x+y \leq 1$) layer doped with Si as the n-type dopant. The active layer 22 may be an $In_xAl_yGa_{1-x-y}N$ ($0 \leq x \leq 1$, $0 \leq y \leq 1$, $0 \leq x+y \leq 1$) layer having a single-quantum well or multi-quantum well (MQW) structure. The second conductivity-type semiconductor layer 23 may also be a nitride-based semiconductor layer, and doped with p-type dopant. For example, the second conductivity-type semiconductor layer 23 may be an $In_xAl_yGa_{1-x-y}N$ ($0 \leq x \leq 1$, $0 \leq y \leq 1$, $0 \leq x+y \leq 1$) layer doped with Mg or Zn as the p-type dopant. The semiconductor structure 20 may be formed using a metal-organic chemical vapor deposition (MOCVD) method or a molecular beam epitaxy (MBE) method.

Figure 1B:
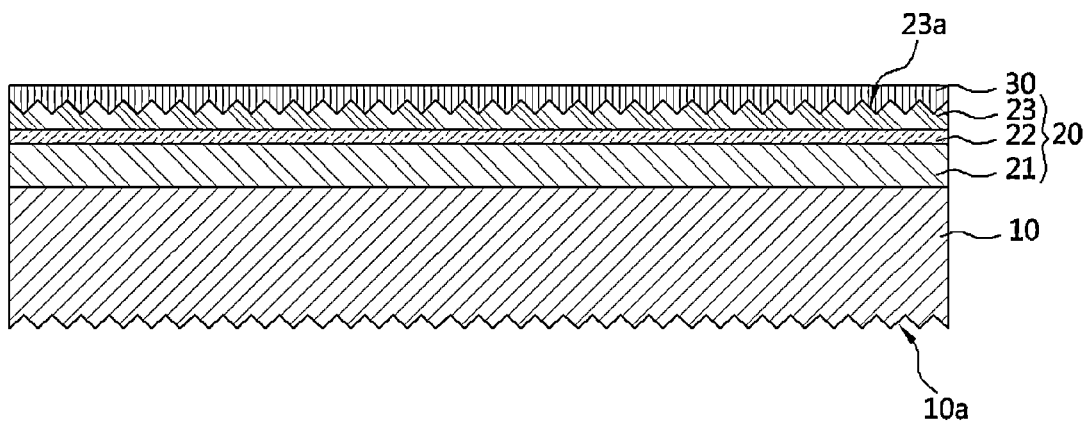

Referring to FIG. 1B, a rough pattern 23a may be formed in an upper surface of the semiconductor structure 20, more specifically, the second conductivity-type semiconductor layer 23. In addition, a rough pattern 10a may be formed in a lower surface of the substrate 10. The rough pattern 23a disposed in the upper surface of the second conductivity-type semiconductor layer 23, and the rough pattern 10a disposed in the lower surface of the substrate 10 may be formed by a plasma etching or photo-electrochemical etching method regardless of each other. However, one or both of the formation of the rough pattern 23a in the upper surface of the second conductivity-type semiconductor layer 23, and the formation of the rough pattern 10a in the lower surface of the substrate 10 may be omitted.

Next, a current spreading conductive layer 30 may be formed on the upper surface of the semiconductor structure 20, more specifically, the second conductivity-type semiconductor layer 23. The current spreading conductive layer 30 may be a transparent conductive layer, for example, an indium tin oxide (ITO) layer.

Figure 1C:
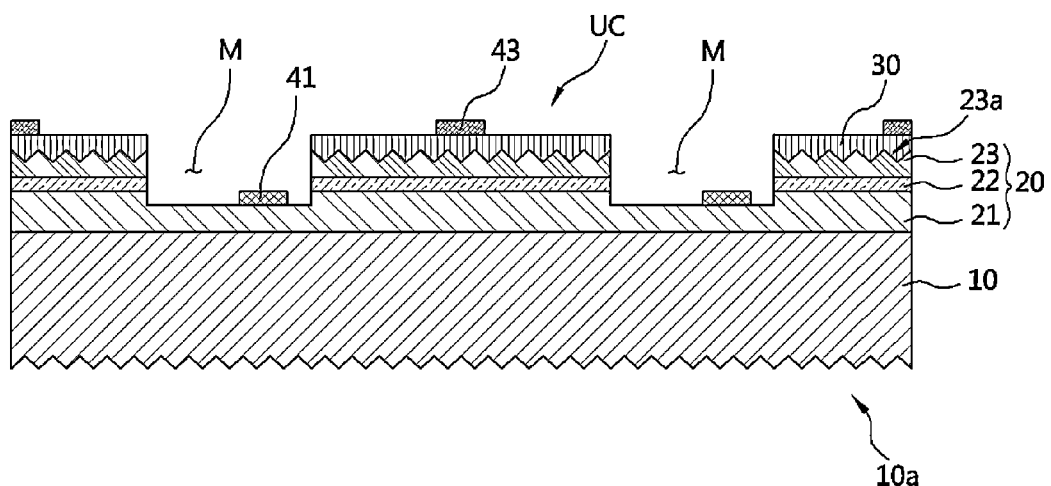

Referring to FIG. 1C, the current spreading conductive layer 30, the second conductivity-type semiconductor layer 23, and the active layer 22 are mesa-etched to expose the first conductivity-type semiconductor layer 21 in the mesa-etched area M. A first electrode 41 and a second electrode 43 may be formed on the exposed first conductivity-type semiconductor layer 21 and the current spreading conductive layer 30, respectively. In FIG. 1C, an inner wall or sidewall of the mesa-etched area M, that is, a mesa face, is described as being perpendicular to an upper surface of the substrate 10, but is not limited thereto. The mesa surface may be inclined to the upper surface of the substrate 10 at a predetermined slope. For example, the mesa-etched area M may have a shape gradually widening or narrowing from a top toward a bottom thereof.

Figure 1D:
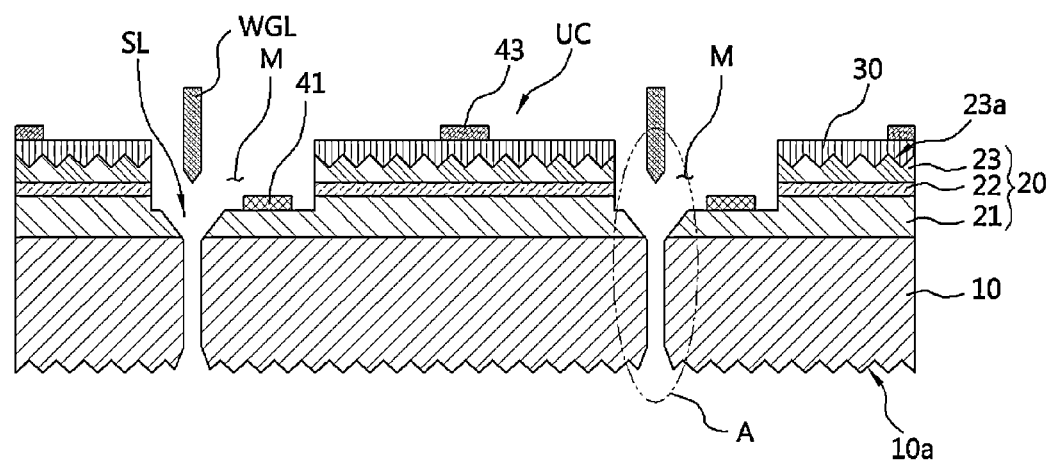

Referring to FIGS. 1D and 2, unit chips UC are separated in such a way that the semiconductor structure 20 and the substrate 10 are scribed to form a scribe lane SL. At the same time, concavo-convex structures CC are formed in side surfaces of the unit chips UC.

For this, the scribing process may be performed using a fluid-jet-guided laser WGL. More specifically, the scribing may be performed by disposing the fluid-jet-guided laser WGL on the semiconductor structure 20, more specifically, on the first conductivity-type semiconductor layer 21, exposed in the mesa-etched area M, and then moving the fluid-jet-guided laser WGL in the direction toward the lower surface of the substrate 10. The fluid may be water.

Figure 3A:
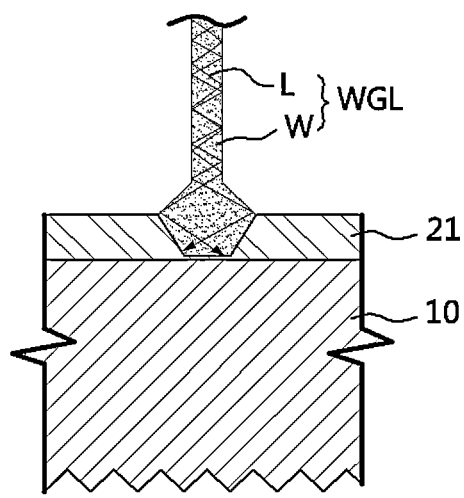
FIGS. 3A to 3C are cross-sectional views sequentially showing process steps of scribing using a fluid-jet-guided laser WGL.
Figure 3B:
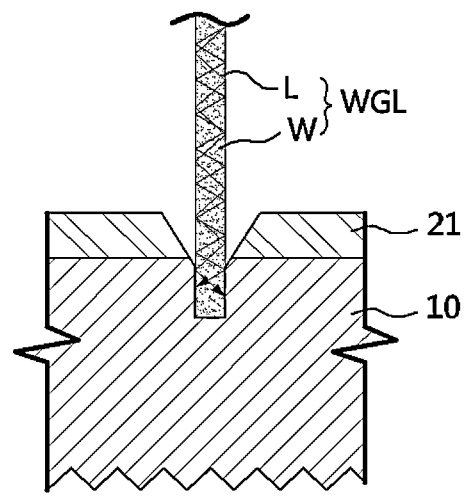
Figure 3C:
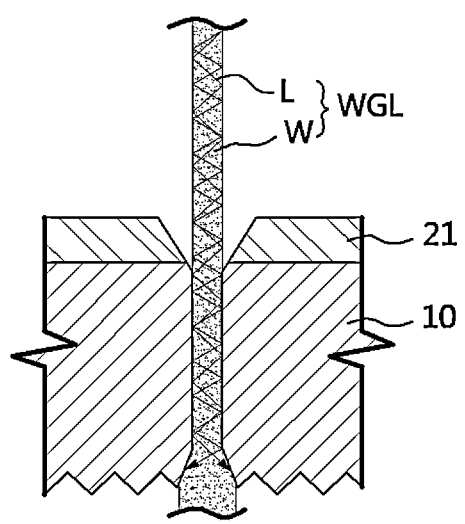

FIGS. 3A to 3C are cross-sectional views sequentially showing process steps of scribing using a fluid-jet-guided laser WGL.

Referring to FIGS. 2 and 3A to 3C, laser beams L in the fluid-jet W, that is, a fluid pillar, progresses, wherein the progress of the laser beams L is limited within the fluid-jet W due to total reflection at an interface between the fluid-jet W and air outside thereof. Here, the plurality of laser beams L progressing in the fluid-jet W become diffused and distributed in the fluid-jet W and in contact with a surface of a material which is to be etched, in different incident angles. As a result, a concavo-convex structure CC having shapes of irregular vertical lines regardless of crystal faces of the semiconductor structure 20, more specifically, the first conductivity-type semiconductor layer 21, or the substrate 10, may be formed in the side surfaces of the unit chips UC unlike when using a dry laser or a physical breaking method. More specifically, widths and/or lengths of grooves disposed in the concavo-convex structure CC may be different from each other, and the arrangement may be irregular. Since the total reflection of light progressing from the active layer (22) to the side surfaces of the unit chip UC in the unit chip UC is reduced due to the concavo-convex structure CC, light extraction efficiency may increase. In FIG. 2, a bottom of each groove is described as being pointed, but is not limited thereto. The bottom of each groove may be curved or flat.

When the fluid-jet W becomes in contact with the surface of the semiconductor structure 20, more specifically, the first conductivity-type semiconductor layer 21, a width of the fluid jet W may increase due to the surface tension of the fluid, as shown in FIG. 3A. In this case, an upper width of the scribe lane SL may be greater than the original width of the fluid-jet W. Next, the width of the fluid-jet W may recover the original width W while an etch process progresses. Accordingly, the width of the scribe lane SL may also correspond to the original width of the fluid-jet W (FIG. 3B). Finally, as the etch process further progresses, the fluid-jet W may pass through the lower surface of the substrate 10. In this case, the width of the fluid-jet W may increase again due to the surface tension (FIG. 3C). Thereby, a lower width of the scribe lane SL may also become greater than the original width of the fluid-jet W.

At this time, an etch rate of the semiconductor structure 20, more specifically, the first conductivity-type semiconductor layer 21, by the fluid-jet-guided laser WGL, and an etch rate of the substrate 10 by the fluid-jet-guided laser WGL, may be the same or different. For example, when the substrate 10 is a sapphire ($Al_2O_3$) substrate, and the first conductivity-type semiconductor layer 21 is a GaN layer, the etch rate of the first conductivity-type semiconductor layer 21 by the fluid-jet-guided laser WGL may be greater than the etch rate of the substrate 10 by the fluid-jet-guided laser WGL. For another example, when the substrate 10 is a GaN substrate, and the first conductivity-type semiconductor layer 21 is a GaN layer, that is, when the substrate 10 and the first conductivity-type semiconductor layer 21 are the same material layers, the etch rate of the first conductivity-type semiconductor layer 21 by the fluid-jet-guided laser WGL may be substantially the same as the etch rate of the substrate 10 by the fluid-jet-guided laser WGL.

Figure 4:
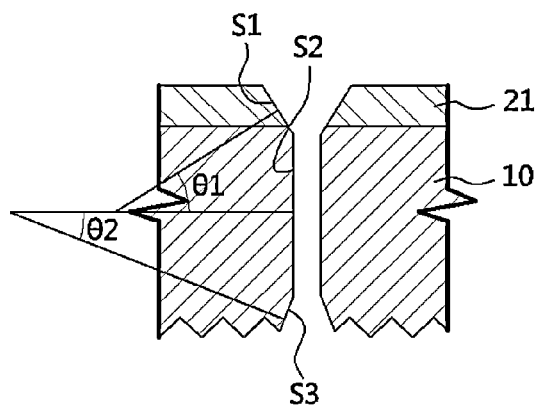
FIG. 4 is an enlarged cross-sectional view showing part A in FIG. 1D.

FIG. 4 is an enlarged cross-sectional view showing part A in FIG. 1D.

Referring to FIGS. 1D, 2, and 4, each of the side surfaces of the unit chips UC exposed in the scribe lane SL includes three faces S1, S2, and S3 of which normal lines are not parallel to each other. A first face S2 is perpendicular to the upper surface of the substrate 10, and a second face S1 and a third face S3 are inclined adjacent to both ends of the first face S2. An angle of inclination of the second face S1 with respect to the first face S2, that is, an angle $\theta_1$ which a normal line to the first face S2 and a normal line to the second face S1 form, may be less than 90 degrees. In addition, an angle of inclination of the third face S3 with respect to the first face S2, that is, an angle $\theta_2$ which a normal line to the first face S2 and a normal line to the third face S3 form, may be less than 90 degrees.

Since the second face S1 and the third face S3, which are the inclined faces, reduce total reflection of light, light extraction efficiency may be improved. Further, a lighting angle may be controlled by adjusting those angles of inclination $\theta_1$ and $\theta_2$ of the inclined faces S1 and S3. The angles of inclination $\theta_1$ and $\theta_2$ of the inclined faces S1 and S3 may vary depending on a pressure and width of the fluid-jet (W in FIGS. 3A to 3C). For example, the pressure of the fluid-jet (W in FIGS. 3A to 3C) may be set at 60 to 300 bar, and the width may be set to a value of 30 to 120 μm. In addition, frequency of the laser may be 6 to 30 kHz, laser power may be 30 to 80 W, and scribing speed may be 20 to 120 mm/s. The number of scribing (scribing passes) may vary depending on the scribing speed, and specifically, may be 1 to 50.

In addition, the angles of inclination $\theta_1$ and $\theta_2$ of the inclined faces S1 and S3 may vary depending on an etch rate of a corresponding layer by the fluid-jet-guided laser WGL. For example, as described above, when the etch rate of the semiconductor structure 20, more specifically, the first conductivity-type semiconductor layer 21 by the fluid-jet-guided laser WGL, is greater than that of the substrate 10, the angle of inclination $\theta_1$ of the second face S1 exposing the first conductivity-type semiconductor layer 21 may be greater than the angle of inclination $\theta_2$ of the third face S3 exposing the substrate 10. For another example, when the etch rate of the semiconductor structure 20, more specifically, the first conductivity-type semiconductor layer 21 by the fluid-jet-guided laser WGL is substantially the same as that of the substrate 10, the angle of inclination $\theta_1$ of the second face S1 exposing the first conductivity-type semiconductor layer 21 may substantially the same as the angle of inclination $\theta_2$ of the third face S3 exposing the substrate 10.

Figure 5:
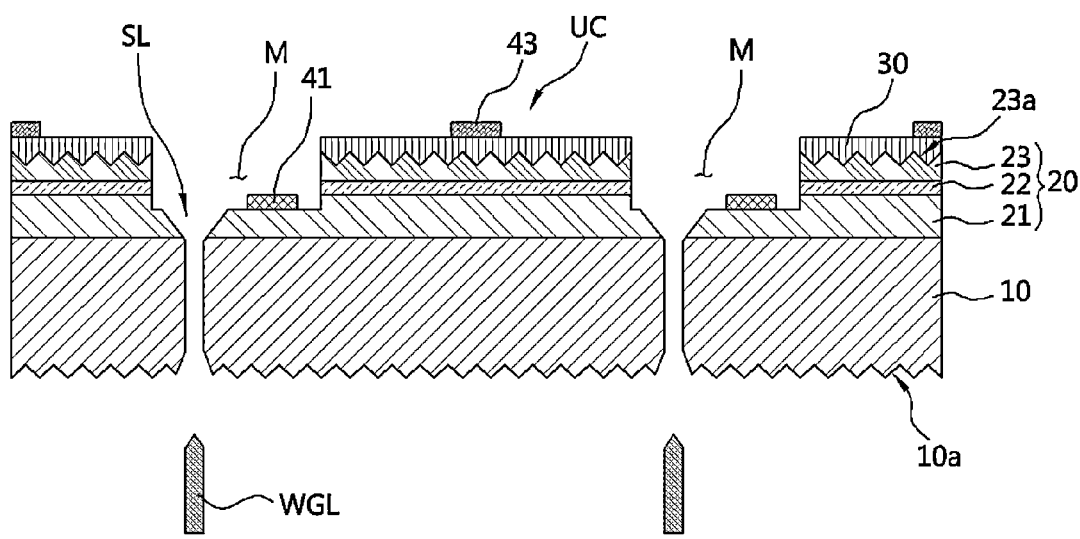
FIG. 5 is a cross-sectional view showing a method of fabricating a light emitting diode in accordance with another exemplary embodiment of the present invention.

FIG. 5 is a cross-sectional view showing a method of fabricating a light emitting diode in accordance with another exemplary embodiment of the present invention. The exemplary embodiment may be substantially the same as the exemplary embodiment described with reference to FIGS. 1A to 1D, except what will be described hereinbelow.

Referring to FIG. 5, unit chips UC are separated in such a way that the semiconductor structure 20 and the substrate 10 are scribed to form a scribe lane SL. At the same time, concavo-convex structures (CC in FIG. 2) are formed in side surfaces of the unit chips UC.

For this, the scribing process may be performed using a fluid-jet-guided laser WGL. More specifically, the scribing process may be performed by disposing the fluid-jet-guided laser WGL on a lower surface of the substrate 10, and then moving the fluid-jet-guided laser WGL in the direction toward an upper surface of the semiconductor structure 20. The fluid may be water.

Figure 6A:
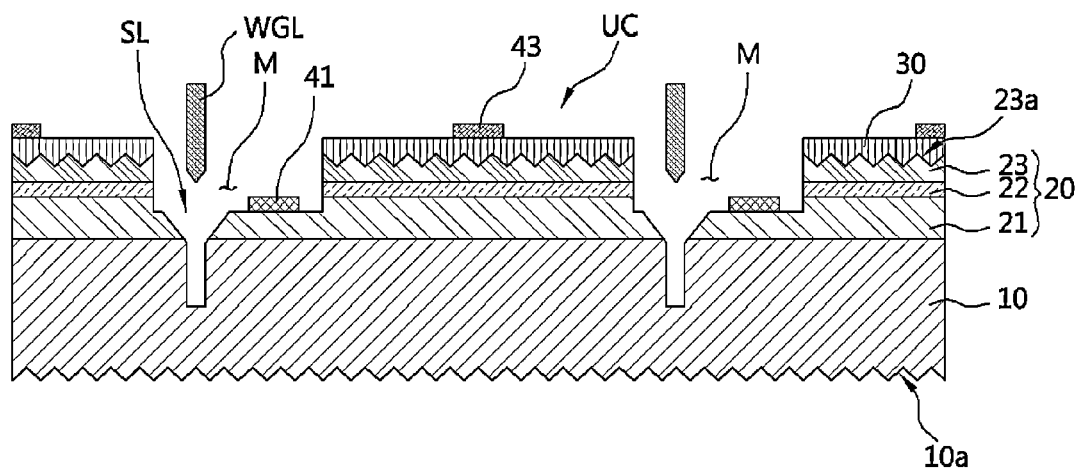
FIGS. 6A to 6B are cross-sectional views showing a method of fabricating a light emitting diode in accordance with still another exemplary embodiment of the present invention.
Figure 6B:
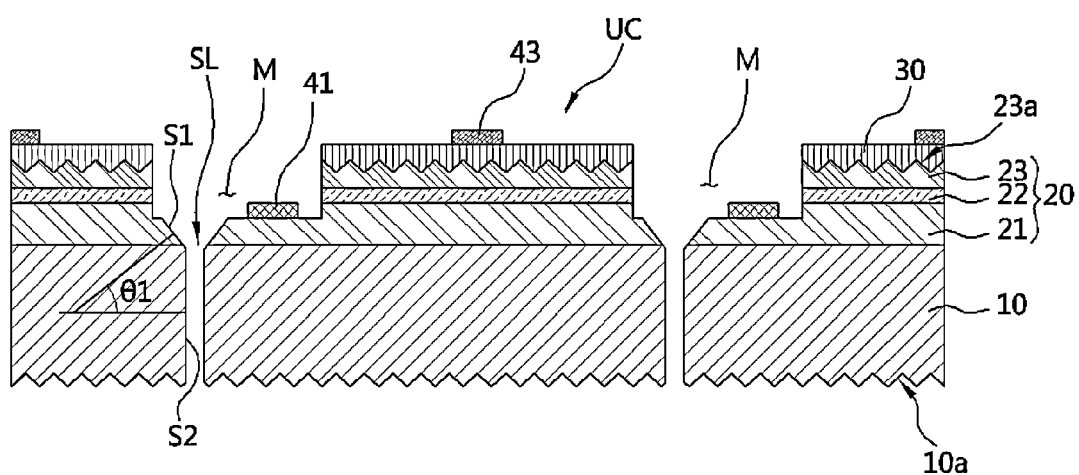
Figure 6C:
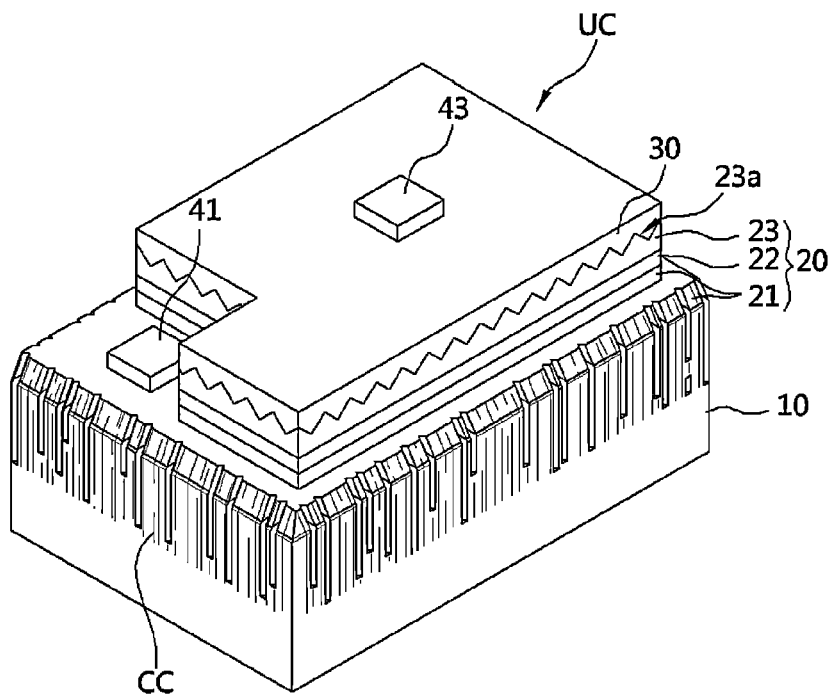
FIG. 6C is a perspective view showing a unit chip formed by the fabrication method of FIGS. 6A and 6B.

FIGS. 6A and 6B are cross-sectional views showing a method of fabricating a light emitting diode in accordance with still another exemplary embodiment of the present invention. FIG. 6C is a perspective view showing a unit chip formed by the fabrication method of FIGS. 6A and 6B. The exemplary embodiment may be substantially the same as the exemplary embodiment described with reference to FIGS. 1A to 1D, and FIG. 2, except what will be described hereinbelow.

Referring to FIGS. 6A, 6B, and 6C, unit chips UC are separated in such a way that a part of the semiconductor structure 20 and the substrate 10 is scribed to form a scribe lane SL.

An upper part of the scribe lane SL may be formed using a fluid-jet-guided laser WGL (FIG. 6A), and a lower part of the scribe lane SL may be formed by a dry laser or a physical breaking method (FIG. 6B).

More specifically, the scribing may be partially performed by disposing the fluid-jet-guided laser WGL on the semiconductor structure 20, more specifically, on the first conductivity-type semiconductor layer 21, exposed in the mesa-etched area M, and then partially moving the fluid-jet-guided laser WGL in the direction toward the lower surface of the substrate 10. Then, the fluid-jet-guided laser WGL is removed. Next, the remaining part that was not scribed by the fluid-jet-guided laser WGL may be cut using a dry laser or a physical breaking method. At this time, the side surfaces of the unit chips UC exposed in an upper part of the scribe lane SL formed using the fluid-jet-guided laser WGL may have concavo-convex structures CC having the shape of irregular vertical lines. More specifically, widths and/or lengths of grooves disposed in the concavo-convex structures CC may be different from each other, and the arrangement may be irregular. The concavo-convex structures CC having the shape of the irregular vertical lines may be formed regardless of a crystal face of the semiconductor structure 20 or the substrate 10, unlike when using a dry laser or physical breaking method.

On the contrary, the side surfaces of the unit chips UC exposed in the lower part of the scribe lane SL formed using the dry laser or the physical breaking method may have a regular rough pattern (not shown) formed along a crystal face of the substrate 10. The concavo-convex structures CC formed in the side surfaces of the unit chips UC exposed in the upper part of the scribe lane SL may have a greater surface roughness than the rough pattern formed in the side surfaces of the unit chips UC exposed in the lower part of the scribe lane SL. In addition, each side surface of the unit chips UC exposed in the lower part of the scribe lane SL formed using the dry laser or the physical breaking method may have no lower inclined face (S3 in FIG. 4) described with reference to FIGS. 1D and 4. Accordingly, each side surface of the unit chips UC exposed in the scribe lane SL may include two faces S1 and S2 having normal lines which are not parallel to each other, that is, a first face S2 perpendicular to an upper surface of the substrate, and a second face S1 which is an inclined face adjacent to the first face S2. An angle of inclination of the second face S1 with respect to the first face S2, that is, an angle $\theta_1$ which a normal line to the first face S2 and a normal line to the second face S1 form, may be less than 90 degrees.

Figure 7A:
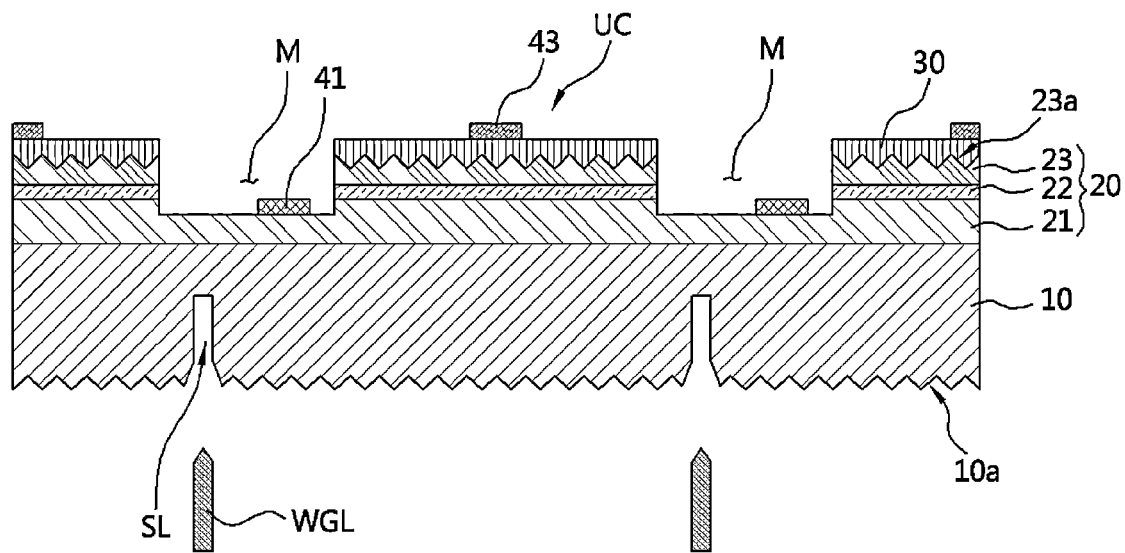
FIGS. 7A and 7B are cross-sectional views showing a method of fabricating a light emitting diode in accordance with still another exemplary embodiment of the present invention.
Figure 7B:
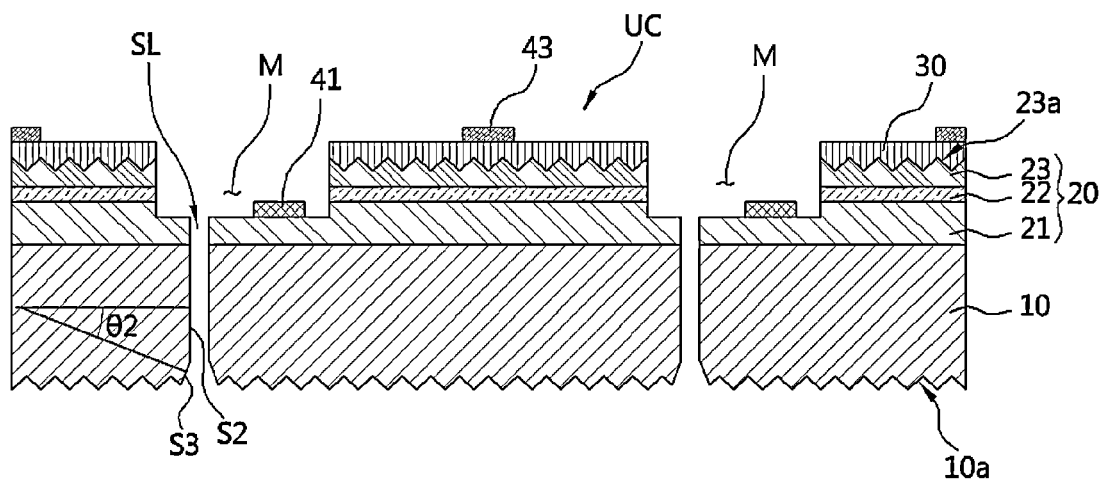
Figure 7C:
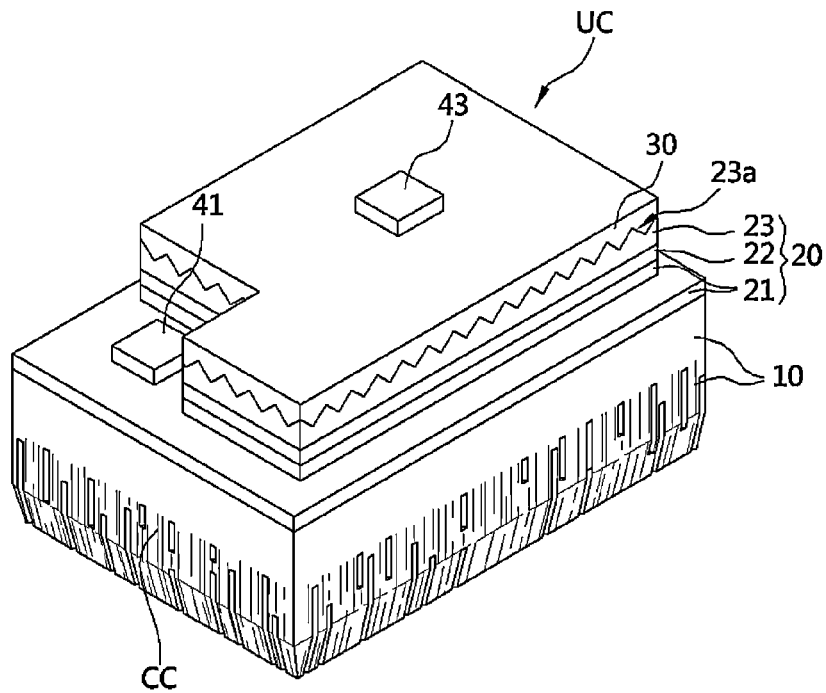
FIG. 7C is a perspective view showing a unit chip formed by the fabrication method of FIGS. 7A and 7B.

FIGS. 7A and 7B are cross-sectional views showing a method of fabricating a light emitting diode in accordance with still another exemplary embodiment of the present invention. FIG. 7C is a perspective view showing a unit chip formed by the fabrication method of FIGS. 7A and 7B. The exemplary embodiment may be substantially the same as the exemplary embodiment described with reference to FIGS. 1A to 1D, and FIG. 2, except what will be described hereinbelow.

Referring to FIGS. 7A, 7B, and 7C, unit chips UC are separated in such a way that a part of the semiconductor structure 20 and the substrate 10 is scribed to form a scribe lane SL.

A lower part of the scribe lane SL may be formed using a fluid-jet-guided laser WGL (FIG. 7A), and the upper part of the scribe lane SL may be formed using a dry laser or a physical breaking method (FIG. 7B). More specifically, the scribing process may be partially performed by disposing the fluid-jet-guided laser WGL on a lower surface of the substrate 10, and then partially moving the fluid-jet-guided laser WGL in the direction toward an upper surface of the substrate 10. Then, the fluid-jet-guided laser WGL is removed. Next, the remaining part that was not scribed by the fluid-jet-guided laser WGL may be cut using a dry laser or a physical breaking method.

At this time, the side surfaces of the unit chips UC exposed in a lower part of the scribe lane SL formed using the fluid-jet-guided laser WGL may have concavo-convex structures CC having the shape of irregular vertical lines. More specifically, widths and/or lengths of grooves disposed in the concavo-convex structures CC may be different from each other, and the arrangement may be irregular. The concavo-convex structures CC having the shape of the irregular vertical lines may be formed regardless of a crystal face of the semiconductor structure 20 or the substrate 10, unlike when using a dry laser or physical breaking method.

On the contrary, the side surfaces of the unit chips UC exposed in the upper part of the scribe lane SL formed using the dry laser or physical cutting method may have a regular rough pattern (not shown) formed along a crystal face of the substrate 10 or the semiconductor structure 20. The concavo-convex structures CC formed in the side surfaces of the unit chips UC exposed in the lower part of the scribe lane SL may have a greater surface roughness than the rough pattern formed in the side surfaces of the unit chips UC exposed in the upper part of the scribe lane SL. In addition, each side surface of the unit chips UC exposed in the upper part of the scribe lane SL formed using the dry laser or the physical breaking method may have no upper inclined face (S1 in FIG. 4) described with reference to FIGS. 1D and 4. Accordingly, each side surface of the unit chips UC exposed in the scribe lane SL may include two faces S2 and S3 having normal lines which are not parallel to each other, that is, a first face S2 perpendicular to an upper surface of the substrate, and a second face S3 which is an inclined face adjacent to the first face S2. An angle of inclination of the second face S3 with respect to the first face S2, that is, an angle $\theta_2$ which a normal line to the first face S2 and a normal line to the second face S3 form, may be less than 90 degrees.

Figure 8A:
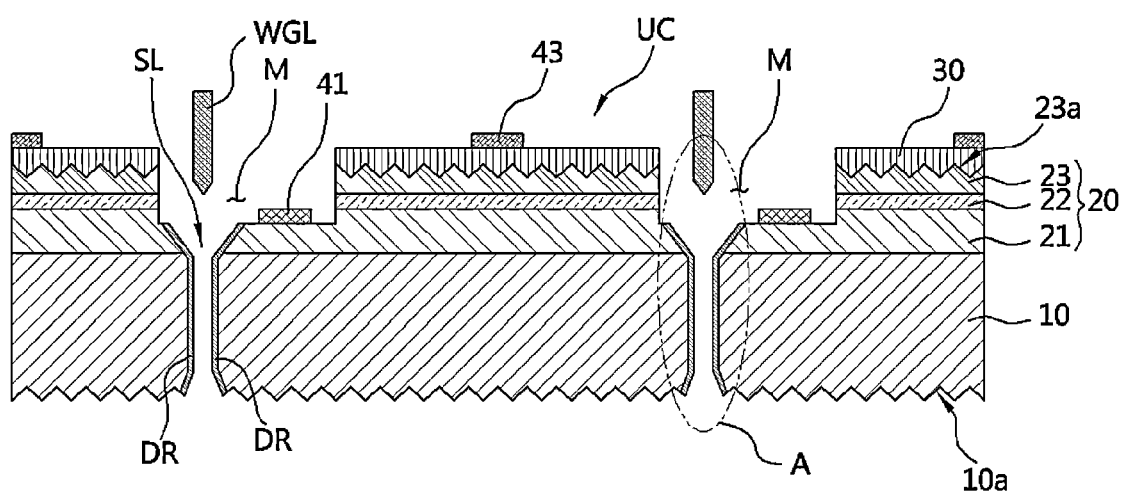
FIGS. 8A and 8B are cross-sectional views showing a method of fabricating a light emitting diode in accordance with still another exemplary embodiment of the present invention.
Figure 8B:
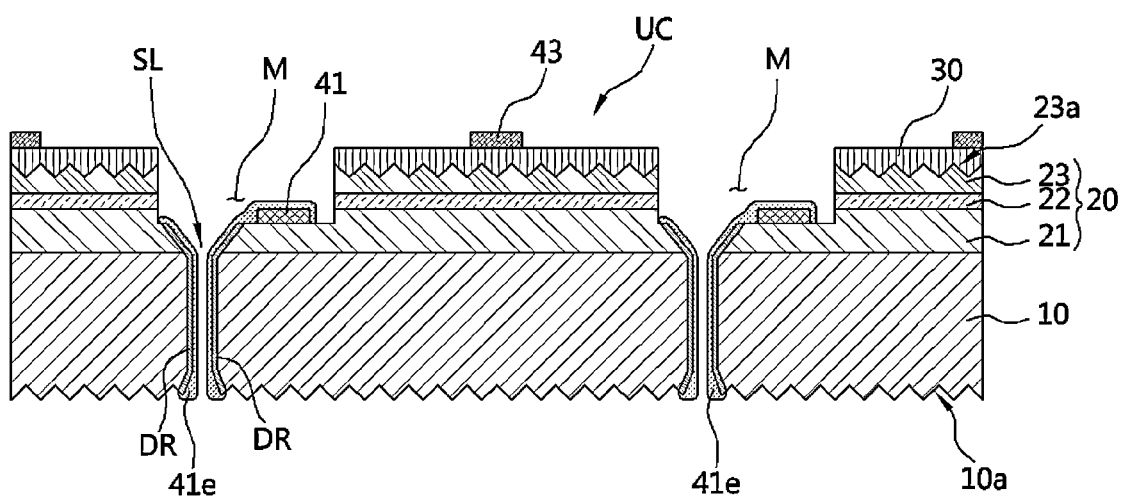

FIGS. 8A and 8B are cross-sectional views showing a method of fabricating a light emitting diode in accordance with still another exemplary embodiment of the present invention. The exemplary embodiment may be substantially the same as the exemplary embodiment described with reference to FIGS. 1A to 1D, and FIG. 2, except what will be described hereinbelow.

Referring to FIG. 8A, unit chips UC are separated in such a way that a part of the semiconductor structure 20 and the substrate 10 is scribed to form a scribe lane SL. A doped region DR may be formed in a side surface exposed by the separation of the unit chips UC. The doped region DR may have a different refractive index from an undoped region. In this case, light emission characteristics may be improved. For example, when a refractive index of the doped region DR has a value between a refractive index of the undoped region in the substrate 10 and a refractive index of air or an encapsulant (not shown), light emission characteristics may be improved as the refractive index gradually decreases in the progress direction of light. In addition, the doped region DR may have an improved conductivity compared to the undoped region, depending on the type of a dopant material.

The scribing process may be performed using a fluid-jet-guided laser WGL including a dopant material. In this case, the doped region DR may be formed at the same time as forming separated unit chips UC by forming the scribe lane SL in the scribing process. Here, a perspective view of the unit chip UC is similar to that described in FIG. 2. However, the doped region DR is not described in FIG. 2. Accordingly, concavo-convex structures (CC in FIG. 2) may be formed in side surfaces of the unit chips UC.

For example, the scribing may be performed by disposing the fluid-jet-guided laser WGL on the semiconductor structure 20, more specifically, on the first conductivity-type semiconductor layer 21, exposed in the mesa-etched area M, and then moving the fluid-jet-guided laser WGL in the direction toward the lower surface of the substrate 10. The fluid may be water. The fluid-jet (W in FIG. 9A) may include a dopant material. The dopant material may be, for example, benzene, ethanol, acetone, phosphoric acid, or boric acid. When the dopant material is phosphoric acid, the doped region DR may be an n-type doped region. When the dopant material is boric acid, the doped region DR may be a p-type doped region. Detailed description thereof will be described with reference to FIGS. 9A to 9C.

Referring to FIG. 8B, an extension electrode 41e may be formed on the first electrode 41 and the doped region DR disposed on the side surface of the unit chip UC. The extension electrode 41e may be formed on all four side surfaces of the unit chip UC. The extension electrode 41e may be formed using a vapor deposition method. Otherwise, the extension electrode 41e may be formed in such a way that a conductive material is coated on the first conductivity-type semiconductor layer 21 exposed in the mesa-etched area, and the conductive material flows along into the side surface of the unit chip UC. The extension electrode 41e may be electrically connected to the first electrode 41, the first conductivity-type semiconductor layer 21, and the doped region DR.

The extension electrode 41e may function as an interconnection connecting the first electrode 41 to an electrode (not shown) disposed on a package substrate. Accordingly, when the extension electrode 41e is formed, no wire bonding to the first electrode 41 may be required.

Figure 9A:
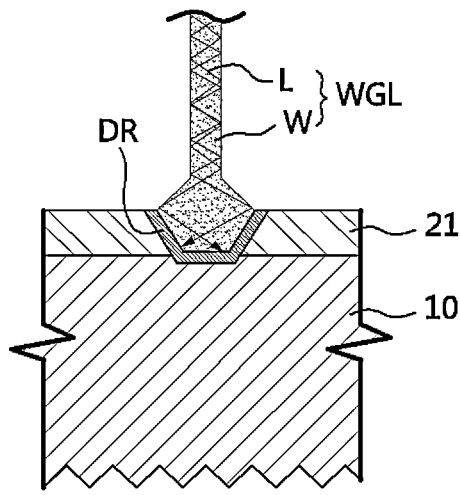
FIGS. 9A to 9C are cross-sectional views sequentially showing process steps of scribing using a fluid-jet-guided laser WGL.
Figure 9B:
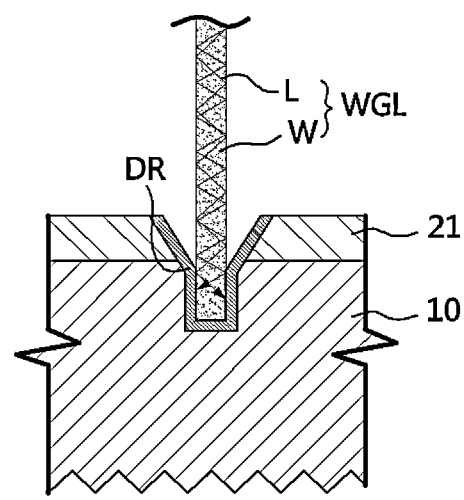
Figure 9C:
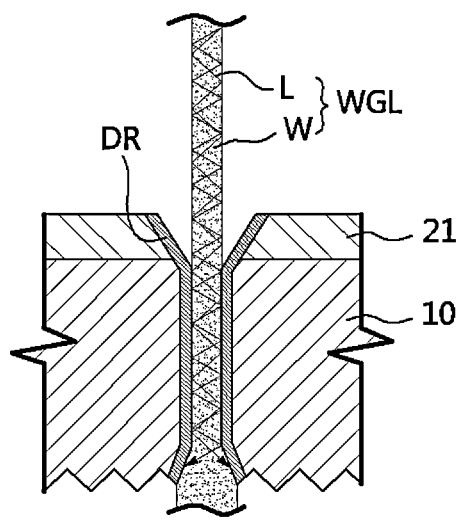

FIGS. 9A to 9C are cross-sectional views sequentially showing process steps of scribing using a fluid-jet-guided laser WGL.

Referring to FIGS. 9A to 9C, laser beams L progresses in a fluid-jet W, that is, a fluid pillar, wherein the progress of the laser beams L is limited within the fluid-jet W due to total reflection at an interface between the fluid-jet W and air outside thereof. The fluid-jet W may include a dopant material. The dopant material may be, for example, benzene, ethanol, acetone, phosphoric acid, or boric acid. In this case, the laser beams L progressing in the fluid-jet W may activate the dopant material, and the activated dopant material may diffuse into a side surface of the unit chip with which the fluid-jet W are in contact to form the doped region DR. When the dopant material is phosphoric acid, the doped region DR may be an n-type doped region, and when the dopant material is boric acid, the doped region DR may be a p-type doped region.

In addition, a plurality of the laser beams L progressing in the fluid-jet W become diffused and distributed in the fluid-jet W and in contact with a surface of a material which is to be etched, in different incident angles. As a result, concavo-convex structures (CC in FIG. 2) having shapes of irregular vertical lines regardless of crystal faces of the semiconductor structure 20, more specifically, the first conductivity-type semiconductor layer 21, or the substrate 10 may be formed in the side surfaces of the unit chips UC, unlike when using a dry laser or physical breaking method. More specifically, widths and/or lengths of grooves disposed in the concavo-convex structures (CC in FIG. 2) may be different from each other, and the arrangement may be irregular. Since the total reflection of light progressing from the active layer (22) to the side surfaces of the unit chip UC in the unit chip UC can be reduced due to the concavo-convex structures CC, light extraction efficiency may increase.

When the fluid-jet W becomes in contact with the surface of the semiconductor structure 20, more specifically, the first conductivity-type semiconductor layer 21, a width of the fluid-jet W may increase due to the surface tension of the fluid (FIG. 9A). In this case, an upper width of the scribe lane SL may be greater than the original width of the fluid-jet W. Next, the width the fluid-jet W may recover the original width W as an etch process progresses. Accordingly, the width of the scribe lane SL may also correspond to the original width of the fluid-jet W (FIG. 9B). Finally, as the etch process further progresses, the fluid-jet W may pass through the lower surface of the substrate 10. In this case, the width of the fluid-jet W may increase again due to the surface tension (FIG. 9C). Thereby, a lower width of the scribe lane SL may also become greater than the original width of the fluid-jet W.

At this time, an etch rate of the semiconductor structure 20, more specifically, the first conductivity-type semiconductor layer 21 by the fluid-jet-guided laser WGL and an etch rate of the substrate 10 by the fluid-jet-guided laser WGL, may be the same or different. For example, when the substrate 10 is a sapphire ($Al_2O_3$) substrate, and the first conductivity-type semiconductor layer 21 is a GaN layer, the etch rate of the first conductivity-type semiconductor layer 21 by the fluid-jet-guided laser WGL may be greater than the etch rate of the substrate 10 by the fluid-jet-guided laser WGL. For another example, when the substrate 10 is a GaN substrate, and the first conductivity-type semiconductor layer 21 is a GaN layer, that is, when the substrate 10 and the first conductivity-type semiconductor layer 21 are the same material layers, the etch rate of the first conductivity-type semiconductor layer 21 by the fluid-jet-guided laser WGL may be substantially the same as the etch rate of the substrate 10 by the fluid-jet-guided laser WGL.

Figure 10:
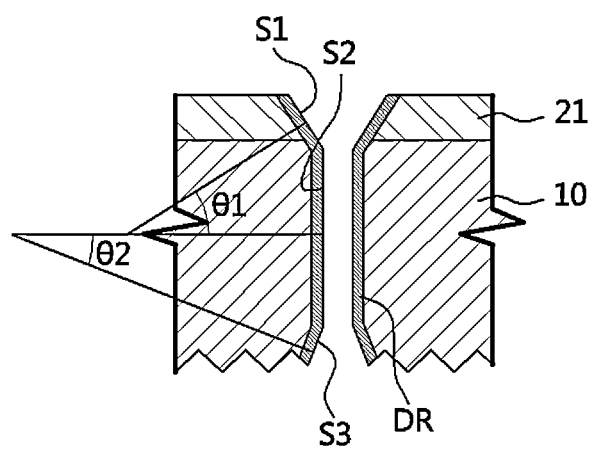
FIG. 10 is an enlarged cross-sectional view showing part A in FIG. 8A.

FIG. 10 is an enlarged cross-sectional view showing part A in FIG. 8A.

Referring to FIGS. 8A and 10, each of side surfaces of the unit chips UC exposed in the scribe lane SL includes three faces S1, S2, and S3 of which normal lines are not parallel to each other. That is, a first face S2 is perpendicular to the upper surface of the substrate 10, and a second face S1 and a third face S3 are inclined adjacent to both ends of the first face S2. An angle of inclination of the second face S1 with respect to the first face S2, that is, an angle $\theta_1$ which a normal line to the first face S2 and a normal line to the second face S1 form, may be less than 90 degrees. In addition, an angle of inclination of the third face S3 with respect to the first face S2, that is, an angle $\theta_2$ which a normal line to the first face S2 and a normal line to the third face S3 form, may be less than 90 degrees.

Since the second face S1 and third face S3, which are the inclined faces, reduce total reflection of light, light extraction efficiency may be improved. Further, a lighting angle may be controlled by adjusting those angles of inclination $\theta_1$ and $\theta_2$ of the inclined faces S1 and S3. The angles of inclination $\theta_1$ and $\theta_2$ of the inclined faces S1 and S3 may vary depending on a pressure and width of the fluid-jet (W in FIGS. 9A to 9C). For example, the pressure of the fluid-jet (W in FIGS. 9A to 9C) may be set at 60 to 300 bar, and the width may be set to a value of 30 to 120 μm. In addition, frequency of the laser may be 6 to 30 kHz, laser power may be 30 to 80 W, and scribing speed may be 20 to 120 mm/s. The number of scribing (scribing passes) may vary depending on the scribing speed, and specifically, may be 1 to 50.

In addition, the angles of inclination $\theta_1$ and $\theta_2$ of the inclined faces S1 and S3 may vary depending on an etch rate of a corresponding layer by the fluid-jet-guided laser WGL. For example, as described above, when the etch rate of the semiconductor structure 20, more specifically, the first conductivity-type semiconductor layer 21 by the fluid-jet-guided laser WGL is greater than that of the substrate 10, the angle of inclination $\theta_1$ of the second face S1 exposing the first conductivity-type semiconductor layer 21 may be greater than the angle of inclination $\theta_2$ of the third face S3 exposing the substrate 10. For another example, when the etch rate of the semiconductor structure 20, more specifically, the first conductivity-type semiconductor layer 21 by the fluid-jet-guided laser WGL is substantially the same as that of the substrate 10, the angle of inclination $\theta_1$ of the second face S1 exposing the first conductivity-type semiconductor layer 21 may substantially the same as the angle of inclination $\theta_2$ of the third face S3 exposing the substrate 10.

Figure 11:
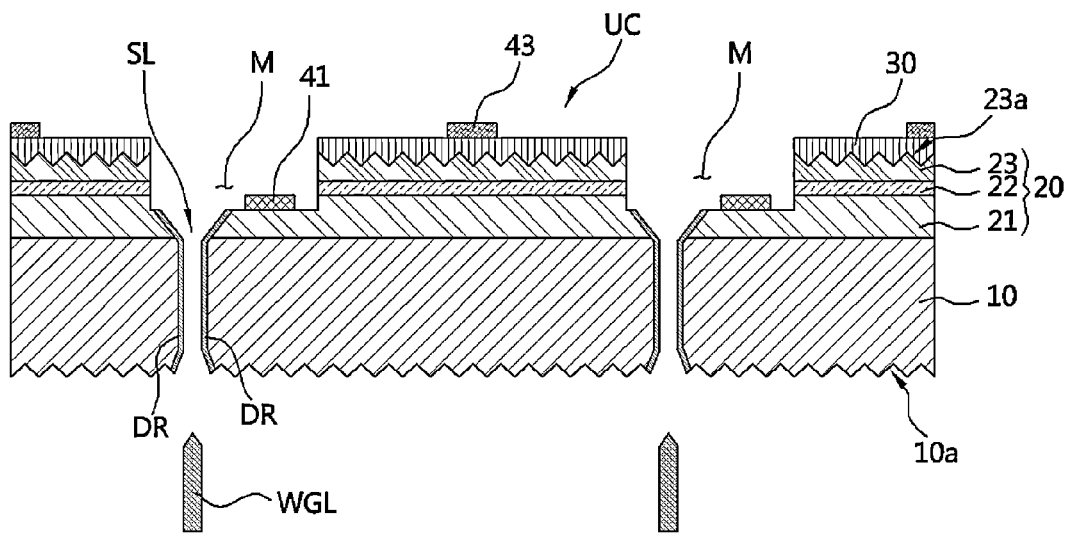
FIG. 11 is a cross-sectional view showing a method of fabricating a light emitting diode in accordance with still another exemplary embodiment of the present invention.

FIG. 11 is a cross-sectional view showing a method of fabricating a light emitting diode in accordance with still another exemplary embodiment of the present invention. The exemplary embodiment may be substantially the same as the exemplary embodiment described with reference to FIG. 8A, except what will be described hereinbelow.

Referring to FIG. 11, unit chips UC are separated in such a way that the semiconductor structure 20 and the substrate 10 are scribed to form a scribe lane SL. At the same time, a doped region DR may be formed in side surfaces exposed by separation of the unit chips UC. In this case, a perspective view of the unit chip UC may be similar to that described in FIG. 2. However, the doped region DR is not described in FIG. 2. Accordingly, concavo-convex structures (CC in FIG. 2) may be formed in the side surfaces of the unit chips UC.

For this, the scribing process may be performed using a fluid-jet-guided laser WGL. More specifically, the scribing process may be performed by disposing the fluid-jet-guided laser WGL on a lower surface of the substrate 10, and then moving the fluid-jet-guided laser WGL in the direction toward an upper surface of the semiconductor structure 20. The fluid may be water. The fluid-jet W may include a dopant material. The dopant material may be, for example, benzene, ethanol, acetone, phosphoric acid, or boric acid. When the dopant material is phosphoric acid, the doped region DR may be an n-type doped region, and when the dopant material is boric acid, the doped region DR may be a p-type doped region.

Figure 12A:
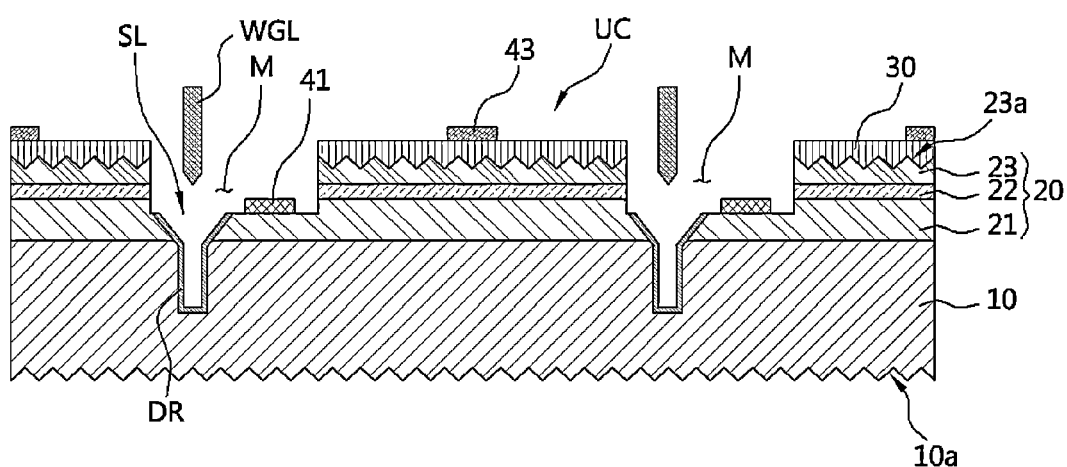
FIGS. 12A and 12B are cross-sectional views showing a method of fabricating a light emitting diode in accordance with still another exemplary embodiment of the present invention.
Figure 12B:
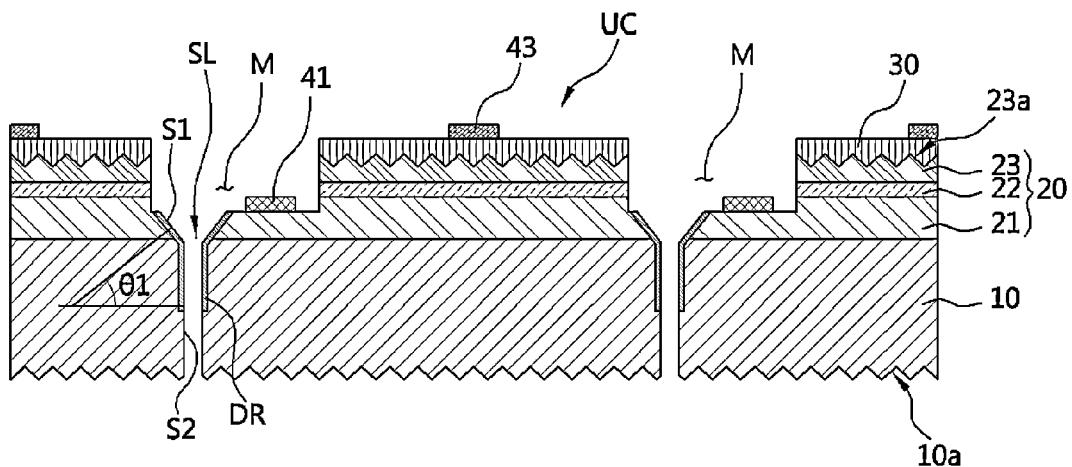

FIGS. 12A and 12B are cross-sectional views showing a method of fabricating a light emitting diode in accordance with still another exemplary embodiment of the present invention. The exemplary embodiment may be substantially the same as the exemplary embodiment described with reference to FIG. 8A, except what will be described hereinbelow.

Referring to FIGS. 12A and 12B, unit chips UC are separated in such a way that a part of the semiconductor structure 20 and the substrate 10 is scribed to form a scribe lane SL. An upper part of the scribe lane SL may be formed using a fluid-jet-guided laser WGL including a dopant material (FIG. 12A), and a lower part of the scribe lane SL may be formed using a dry laser or physical breaking method (FIG. 12B). The dopant material may be, for example, benzene, ethanol, acetone, phosphoric acid, or boric acid. When the dopant material is phosphoric acid, the doped region DR may be an n-type doped region, and when the dopant material is boric acid, the doped region DR may be a p-type doped region.

More specifically, the scribing may be partially performed by disposing the fluid-jet-guided laser WGL on the semiconductor structure 20, more specifically, on the first conductivity-type semiconductor layer 21, exposed in the mesa-etched area M, and then partially moving the fluid-jet-guided laser WGL in the direction toward the lower surface of the substrate 10. Then, the fluid-jet-guided laser WGL is removed. Next, the remaining part that was not scribed by the fluid-jet-guided laser WGL may be cut using the dry laser or physical breaking method.

In this case, a perspective view of the unit chip UC may be similar to that described in FIG. 6C. However, the doped region DR is not described in FIG. 6C. Side surfaces of the unit chips UC exposed in an upper part of the scribe lane SL formed using the fluid-jet-guided laser WGL including the dopant material may have both the doped region DR and concavo-convex structures (CC in FIG. 6C) having the shape of irregular vertical lines. Widths and/or lengths of grooves disposed in the concavo-convex structures CC may be different from each other, and the arrangement may be irregular. The concavo-convex structures CC having the shape of the irregular vertical lines may be formed regardless of a crystal face of the semiconductor structure 20 or the substrate 10, unlike when using a dry laser or physical breaking method.

On the contrary, the side surfaces of the unit chips UC exposed in the lower part of the scribe lane SL formed using the dry laser or physical breaking method may have no doped region, and have a regular rough pattern (not shown) formed along a crystal face of the substrate 10. The concavo-convex structures (CC in FIG. 6C) formed in the side surfaces of the unit chips UC exposed in the upper part of the scribe lane SL may have a greater surface roughness than the rough pattern formed in the side surfaces of the unit chips UC exposed in the lower part of the scribe lane SL.

In addition, each side surface of the unit chips UC exposed in the lower part of the scribe lane SL formed using the dry laser or physical cutting method may have no lower inclined face (S3 in FIG. 10) described with reference to FIGS. 8A and 10. Accordingly, each side surface of the unit chips UC exposed in the scribe lane SL may include two faces S1 and S2 having normal lines which are not parallel to each other, that is, a first face S2 perpendicular to an upper surface of the substrate 10, and a second face S1 which is an inclined face adjacent to the first face S2. An angle of inclination of the second face S1 with respect to the first face S2, that is, an angle $\theta_1$ which a normal line to the first face S2 and a normal line to the second face S1 form, may be less than 90 degrees.

Figure 13A:
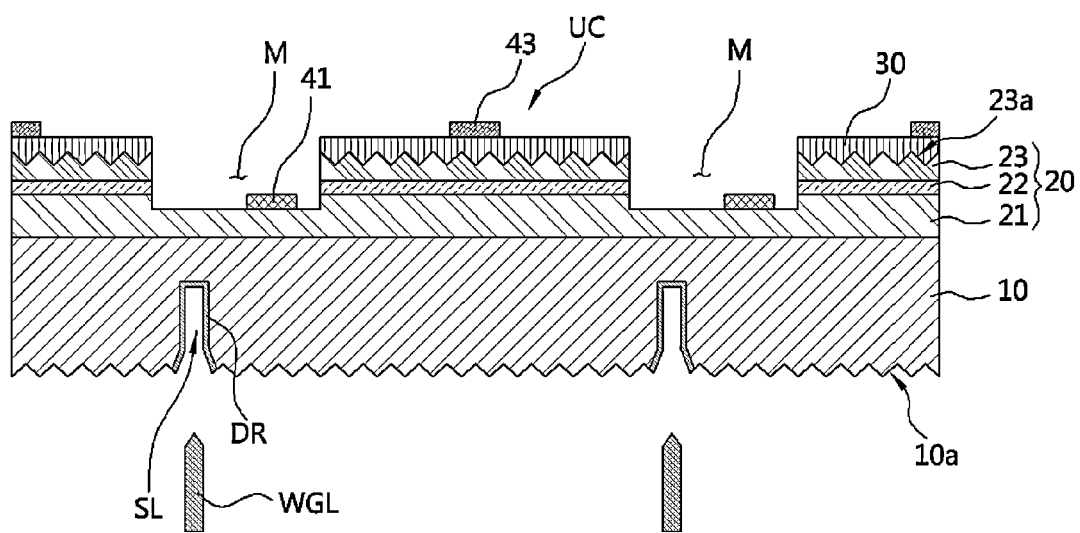
FIGS. 13A and 13B are cross-sectional views showing a method of fabricating a light emitting diode in accordance with still another exemplary embodiment of the present invention.
Figure 13B:
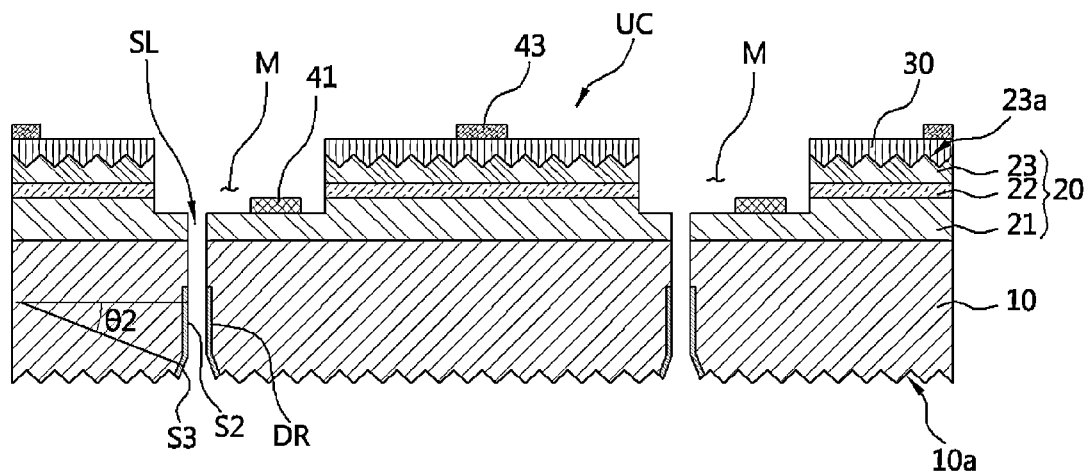

FIGS. 13A and 13B are cross-sectional views showing a method of fabricating a light emitting diode in accordance with still another exemplary embodiment of the present invention. The exemplary embodiment may be substantially the same as the exemplary embodiment described with reference to FIG. 8A, except what will be described hereinbelow.

Referring to FIGS. 13A and 13B, unit chips UC are separated in such a way that a part of the semiconductor structure 20 and the substrate 10 is scribed to form a scribe lane SL. A lower part of the scribe lane SL may be formed using a fluid-jet-guided laser WGL including a dopant material (FIG. 13A), and an upper part of the scribe lane SL may be formed using a dry laser or physical cutting method (FIG. 13B). More specifically, the scribing process may be partially performed by disposing the fluid-jet-guided laser WGL on a lower surface of the substrate 10, and then partially moving the fluid-jet-guided laser WGL in the direction toward an upper surface of the substrate 10. Then, the fluid-jet-guided laser WGL is removed. Next, the remaining part that was not scribed by the fluid-jet-guided laser WGL may be cut using a dry laser or physical cutting method.

In this case, a perspective view of the unit chip UC may be similar to that described in FIG. 7C. However, the doped region DR is not described in FIG. 7C. Side surfaces of the unit chips UC exposed in a lower part of the scribe lane SL formed using the fluid-jet-guided laser WGL including the dopant material may have both the doped region DR and concavo-convex structures (CC in FIG. 7C) having the shape of irregular vertical lines. More specifically, widths and/or lengths of grooves disposed in the concavo-convex structure CC may be different from each other, and the arrangement may be irregular. The concavo-convex structure CC having the shape of the irregular vertical lines may be formed regardless of a crystal face of the semiconductor structure 20 or the substrate 10, unlike when using a dry laser or physical breaking method.

On the contrary, the side surfaces of the unit chips UC exposed in the upper part of the scribe lane SL formed using the dry laser or physical cutting method may have no doped region, and have a regular rough pattern (not shown) formed along a crystal face of the substrate 10 or the semiconductor structure 20. The concavo-convex structures (CC in FIG. 7C) formed in the side surfaces of the unit chips UC exposed in the lower part of the scribe lane SL may have a greater surface roughness than the rough pattern formed in the side surfaces of the unit chips UC exposed in the upper part of the scribe lane SL. In addition, each side surface of the unit chips UC exposed in the upper part of the scribe lane SL formed using the dry laser or physical cutting method may have no upper inclined face (S1 in FIG. 10) described with reference to FIGS. 8A and 10. Accordingly, each side surface of the unit chips UC exposed in the scribe lane SL may include two faces S2 and S3 having normal lines which are not parallel to each other, that is, a first face S2 perpendicular to an upper surface of the substrate 10, and a second face S3 which is an inclined face adjacent to the first face S2. An angle of inclination of the second face S3 with respect to the first face S2, that is, an angle $\theta_2$ which a normal line to the first face S2 and a normal line to the second face S3 form, may be less than 90 degrees.

Figure 14A:
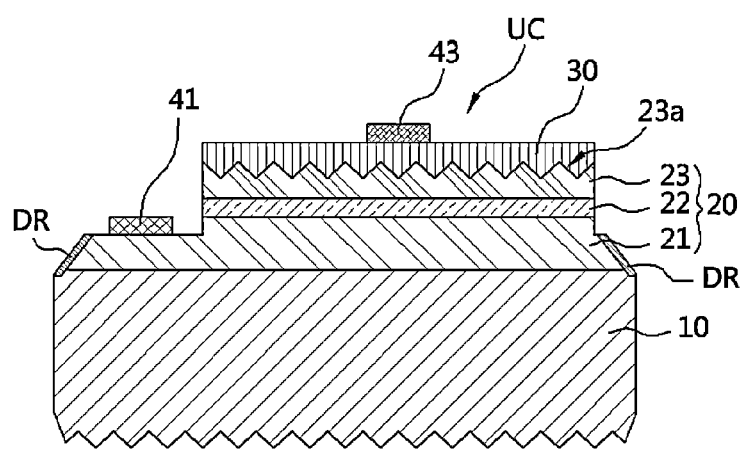
FIGS. 14A to 14C each are cross-sectional views showing a method of fabricating a light emitting diode in accordance with still other exemplary embodiments of the present invention.
Figure 14B:
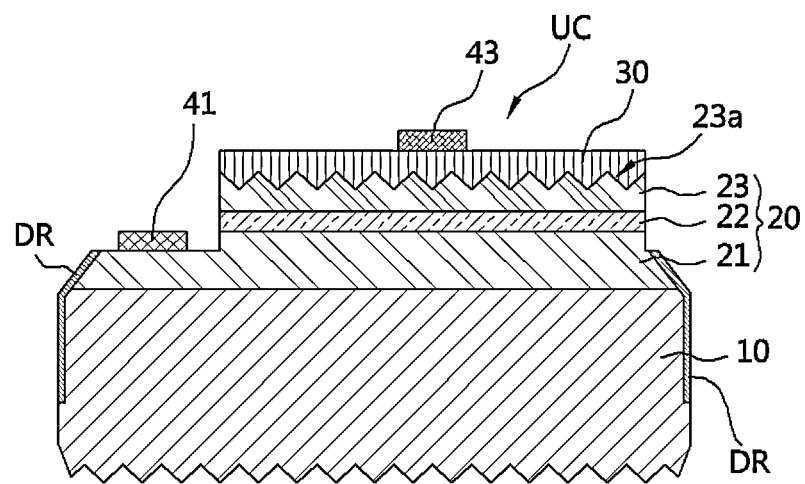
Figure 14C:
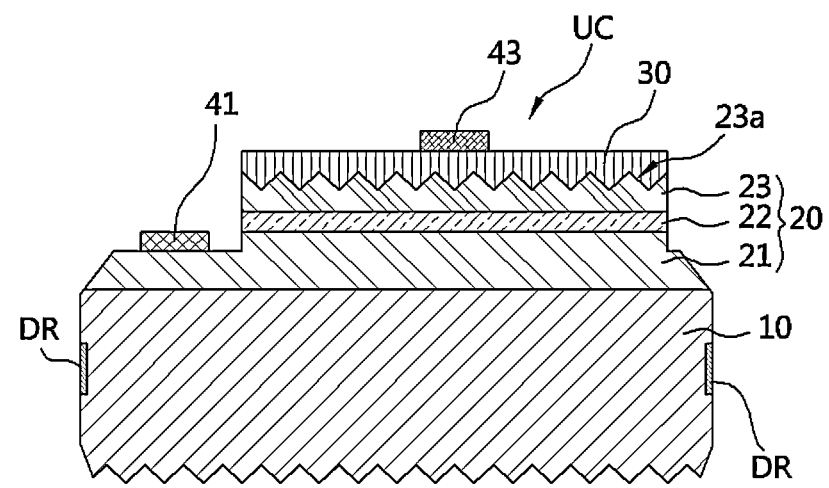

On FIGS. 13A and 13B, it is described that the fluid-jet-guided laser WGL scribes only a portion of the substrate 10 and therefore the doped region DR is formed in only a portion of the side surface of the substrate 10, but the present invention is not limited thereto. The fluid-jet-guided laser WGL may scribe the substrate 10 until the lower surface of the semiconductor structure 20 is exposed in the scribe lane SL, then the remaining semiconductor structure 20 may be cut using dry laser or physical cutting method. Therefore, the doped region DR may be formed in the entire side surface of the substrate 10 in the scribe lane SL. Then, an extension electrode (41e in FIG. 8B) can be formed on the first electrode 41 and the doped region DR, and can function as an interconnection connecting the first electrode 41 to an electrode (not shown) disposed on a package substrate. FIGS. 14A to 14C each are cross-sectional views showing a method of fabricating a light emitting diode in accordance with still other exemplary embodiments of the present invention.

In the exemplary embodiments of the present invention described with reference to FIGS. 8A, 11, 12A, and 13A, both of the concavo-convex structures (CC in FIG. 2, 6C, or 7C) and the doped region DR are formed at the same time. However, Referring to FIGS. 14A to 14C, the location of the doped region DR may be selectively limited by adding or removing the dopant material from the fluid-jet during the scribing process using the fluid-jet-guided laser WGL. More specifically, when the dopant material is added in the fluid-jet, the concavo-convex structures (CC in FIG. 2, 6C, or 7C) and the doped region DR may be formed at the same time. On the contrary, when no dopant material is added in the fluid-jet, only the concavo-convex structures (CC in FIG. 2, 6C, or 7C) may be formed without forming of the doped region DR.

For example, the doped region DR may be formed only at an upper part of a side surface of the unit chip UC, more specifically, at a side surface of the first conductivity-type semiconductor layer 21 (FIG. 14A). For another example, the doped region DR may be formed only at the upper part of the side surface of the unit chip UC, more specifically, the side surface of the first conductivity-type semiconductor layer 21, and a center part of the unit chip UC, more specifically, an upper and center part of the side surface of the substrate 10 (FIG. 14B). For still another example, the doped region DR may be formed at a center of the side surface of the unit chip UC, more specifically, the center part of the side surface of the substrate 10 (FIG. 14C). For still another examples, the doped region DR may be formed in the entire side surface of the substrate.

Hereinafter, an exemplary example will be provided for easier understanding of the present invention. However, the following exemplary embodiment is illustrative of the present invention, and is not to be construed as limiting thereof.

Fabrication Example

A part of a semiconductor structure and a substrate was scribed using a water-guided-laser, and then the remaining part was physically cut.

Comparative Example

A part of a semiconductor structure and a substrate was scribed using a dry laser, and then the remaining part was physically cut.

Figure 15A:
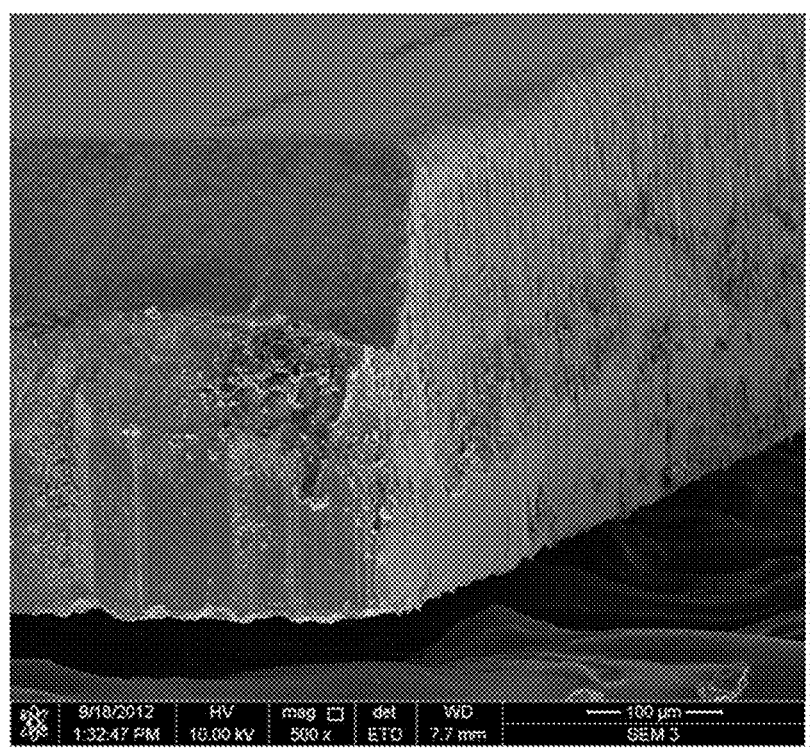
FIGS. 15A and 15B are photographs respectively showing side surfaces of unit chips of a fabrication example and comparative example.
Figure 15B:
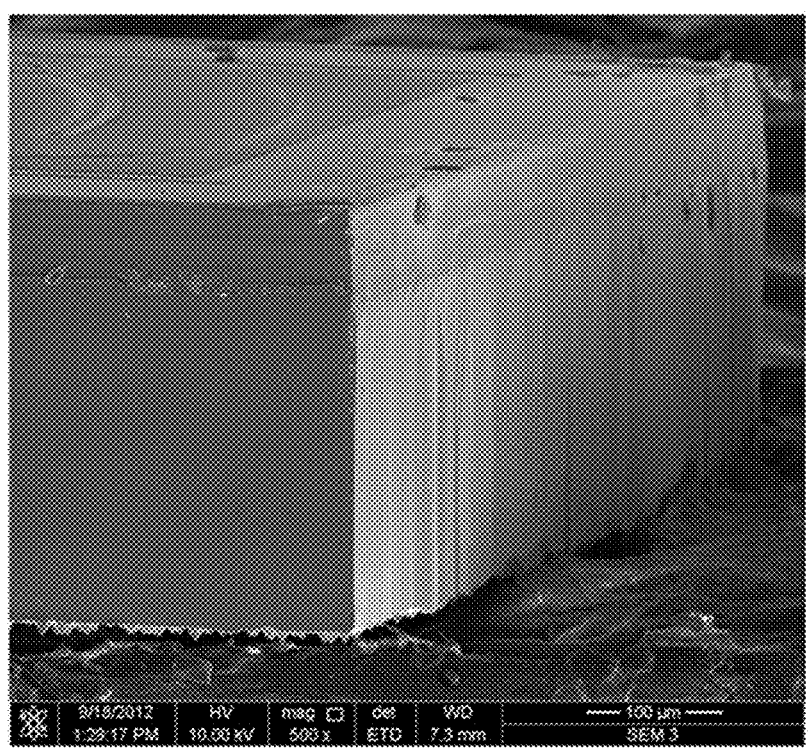

FIGS. 15A and 15B are photographs respectively showing side surfaces of unit chips of the fabrication example and comparative example.

Referring to FIG. 15A, concavo-convex structures having the shape of irregular vertical lines were formed in the side surfaces of the unit chip. In addition, widths and/or lengths of grooves disposed in the concavo-convex structures CC may be different from each other, and the arrangement may be irregular. Further, an inclined face was formed at an upper part of the side surface of the unit chip.

On the contrary, referring to FIG. 15B, a part scribed using a dry laser, that is, an upper part of the side surface of the unit chip, had a very smooth surface. Further, a part physically cut, that is, a lower part of the side surface of the unit chip, had regular vertical lines corresponding to a crystal face of the substrate.

According to the exemplary embodiments of the present invention, since total reflection of light is reduced by forming a concavo-convex structure in a side surface of a unit chip, light extraction efficiency may be improved. In addition, the side surface of the unit chip may have an inclined face at an upper surface or a lower surface thereof. The light extraction efficiency may be further improved since the total reflection of light is also reduced by the inclined face.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method of fabricating a light emitting diode (LED), comprising: sequentially stacking a first conductivity-type semiconductor layer; an active layer, and a second conductivity-type semiconductor layer on a substrate; separating the substrate along at least two side surfaces into unit chips, and at the same time, forming a concavo-convex structure having a shape of irregular vertical lines in the at least two side surfaces of at least one of the unit chips; and forming an extension electrode electrically connected to the first conductivity-type semiconductor layer, on the at least two side surfaces of the at least one of the unit chips, wherein an entirety of the extension electrode is formed below a top surface of the active layer.

2. The method as claimed in claim 1, wherein grooves disposed in the concavo-convex structure have different widths and/or lengths from each other.

3. The method as claimed in claim 1, wherein the separating of the substrate into the unit chips includes scribing the substrate using a fluid-jet-guided laser.

4. The method as claimed in claim 1, wherein separating of the substrate into the unit chips includes forming a doped region in at least a part of one of the at least two side surfaces of the at least one of the unit chips.

5. The method as claimed in claim 4, wherein the forming of the doped region at the same time as forming the concavo-convex structure in one of the at least two side surfaces of the at least one of the unit chips is performed using a fluid-jet-guided laser including a dopant material.

6. The method as claimed in claim 4, wherein the forming of the concavo-convex structure in an undoped region of one of the at least two side surfaces of the at least one of the unit chips is performed using a fluid-jet-guided laser including no dopant material.

7. The method as claimed in claim 4, wherein the doped region has a different refractive index from an undoped region.

8. The method as claimed in claim 4, wherein the doped region has a higher conductivity than an undoped region.

9. A method of fabricating a light emitting diode (LED), comprising:
sequentially stacking a first conductivity-type semiconductor layer, an active layer, and a second conductivity-type semiconductor layer on a substrate;
separating the substrate into unit chips, and at the same time, forming a first face perpendicular to an upper surface of the substrate, a second face inclined with respect to the first face in a side surface of at least one of the unit chips, and a third face inclined with respect to the first face; and
forming an extension electrode electrically connected to the first conductivity-type semiconductor layer, on the side surface of the at least one of the unit chips,
wherein:
an angle $\theta_1$ formed by a normal line to the first face and a normal line to the second face is less than 90 degrees;

an angle $\theta_2$ formed by a normal line to the first face and a normal line to the third face is less than 90 degrees;

the first conductivity-type semiconductor layer is exposed in the second face;

the substrate is exposed in the third face;

angle $\theta_1$ is greater than angle $\theta_2$.

10. The method as claimed in claim 9, wherein the separating of the substrate into the unit chips includes scribing the substrate using a fluid-jet-guided laser.

11. The method as claimed in claim 10, wherein the separating of the substrate into the unit chips comprises:

partially scribing the substrate using the fluid-jet-guided laser; and physically cutting a remaining part of the substrate.

12. The method as claimed in claim 9, wherein the separating of the substrate into the unit chips includes fully scribing the substrate using a fluid-jet-guided laser.

13. The method as claimed in claim 9, wherein the separating of the substrate into the unit chips includes forming a doped region in at least a part of the side surface of the at least one of the unit chips.

14. The method as claimed in claim 13, wherein the forming of the doped region is performed using a fluid-jet-guided laser including a dopant material.

15. The method as claimed in claim 13, wherein the doped region has a different refractive index from an undoped region.

16. The method as claimed in claim 13, wherein the doped region has a higher conductivity than an undoped region.

17. A method of fabricating a light emitting diode (LED), comprising: sequentially stacking a first conductivity-type semiconductor layer, an active layer; and a second conductivity-type semiconductor layer on a substrate; separating the substrate along at least two side surfaces into unit chips; forming a doped region in at least a part of the at least two side surfaces of at least one of the unit chips exposed during the separation; and forming an extension electrode electrically connected to the first conductivity-type semiconductor layer, on the at least two side surfaces of the at least one of the unit chips, wherein an entirety of the extension electrodes is formed below a to surface of the active layer.

18. The method as claimed in claim 17, wherein the forming of the doped region includes scribing the substrate using a fluid-jet-guided laser including a dopant material.

19. The method as claimed in claim 17, wherein the doped region is an n-type doped region.

* * * * *